US005525811A

United States Patent [19]
Sakurai et al.

[11] Patent Number: 5,525,811
[45] Date of Patent: Jun. 11, 1996

[54] ORGANIC QUANTUM SEMICONDUCTOR AND QUANTUM SEMICONDUCTOR DEVICE

[75] Inventors: Kikukazu Sakurai; Shigemasa Takano, both of Tokyo, Japan

[73] Assignee: NEC Corporation, Tokyo, Japan

[21] Appl. No.: 319,781

[22] Filed: Oct. 7, 1994

Related U.S. Application Data

[63] Continuation of Ser. No. 101,819, Aug. 4, 1993, abandoned, which is a continuation of Ser. No. 713,777, Jun. 12, 1991, abandoned.

[30] Foreign Application Priority Data

Jun. 12, 1990 [JP] Japan ..................... 2-153762

[51] Int. Cl.$^6$ .............................. H01L 35/24; H01L 51/00
[52] U.S. Cl. .................. 257/40; 257/15; 257/21; 257/22
[58] Field of Search .................. 357/8, 45 L; 257/40, 257/15, 22, 21

[56] References Cited

U.S. PATENT DOCUMENTS 4,939,556  7/1990  Eguchi et al. ........................ 357/8

FOREIGN PATENT DOCUMENTS

| 0252756 | 1/1988 | European Pat. Off. | 357/8 |
| 0260152 | 3/1988 | European Pat. Off. | 357/8 |
| 63-6878 | 1/1988 | Japan | 357/4 |
| 63-153866 | 6/1988 | Japan | 357/4 |
| 63-244678 | 10/1988 | Japan | 357/8 |
| 2-12871 | 1/1990 | Japan | 357/8 |

OTHER PUBLICATIONS

Turek, P. et al. "A New Series of Molecular Semiconductors: Phthalocyanine Radicals" J. Am. Chem. Soc. 1987, 109, 5119–5122.

Organic Semiconductors Part B (F. Gutmann, et al., R. E. Krieger Publishing, 1983), cover page and pp. 576–577.

Organic Semiconductors Dark and Photoconductivity of Organic Solids (H. Meier, Verlag Chemie, 1974), cover page and pp. 134–135.

Phthalocyanines Properties and Applications (C. C. Leznoff, et al., VCH Publishers, 1989), cover page and pp. 96–97.

The Phthalocyanines, vol. II Manufacture and Applications (F. H. Moser, et al., CRC Press, Inc., 1983), cover page and Table of Contents page.

Coordination Compounds of Porphyrins and Phthalocyanines, (B. D. Berezin, John Wiley & Sons, 1981), cover page and pp. 26–27.

Molecular Crystals and Molecules (A. L. Kitaigorodsky, Academic Press, 1973), cover page and pp. 548–549.

Electrical Transport in Solids, (KAO, et al., Pergamon Press, 1981), cover page and page including Table 1.1.

Electronic Processes in Organic Crystals (M. Pope, et al., Oxford University Press, 1982) cover page and an index page beginning with "α–particle track".

Organic Molecular Crystals (E. A. Silinsh, Springer–Verlag, 1980), cover page and pp. 14–15.

Electrical Properties of Polymers (D. A. Seanor, Academic Press, 1982), cover page and index p. 369.

*Primary Examiner*—Sara W. Crane
*Attorney, Agent, or Firm*—Burns, Doane, Swecker & Mathis

[57] ABSTRACT

An organic semiconductor including an organic semiconductor layer, which layer is formed by epitaxially depositing molecules of a compound selected from phthalocyanines to form a super-thin film configuration including one-dimensional columns of stacked molecules in the form of quantum wires separated respectively from each other.

20 Claims, 10 Drawing Sheets

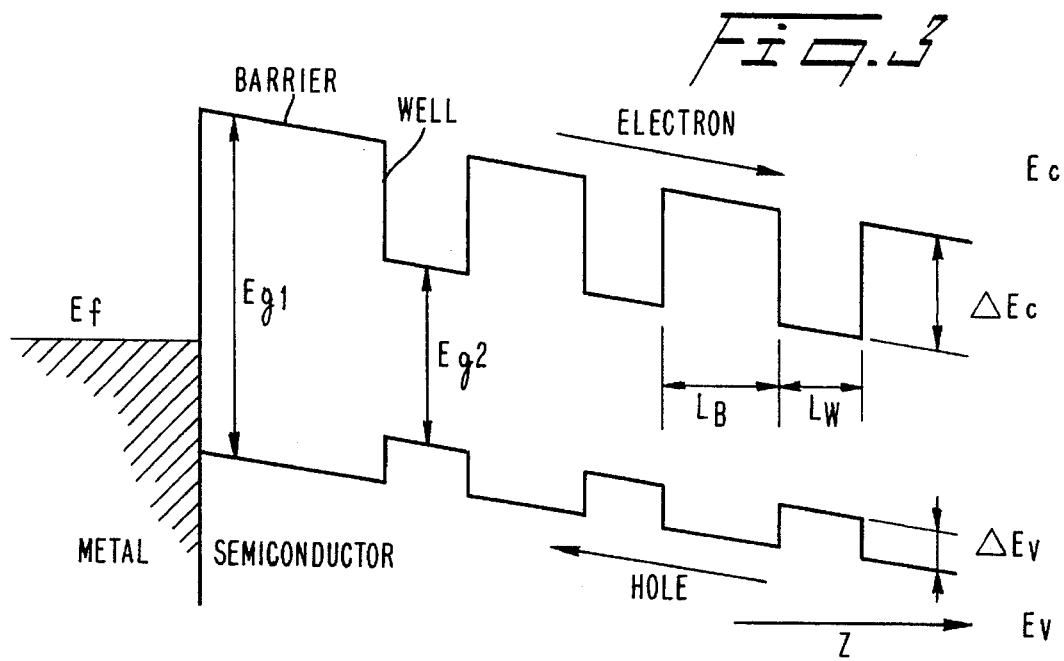
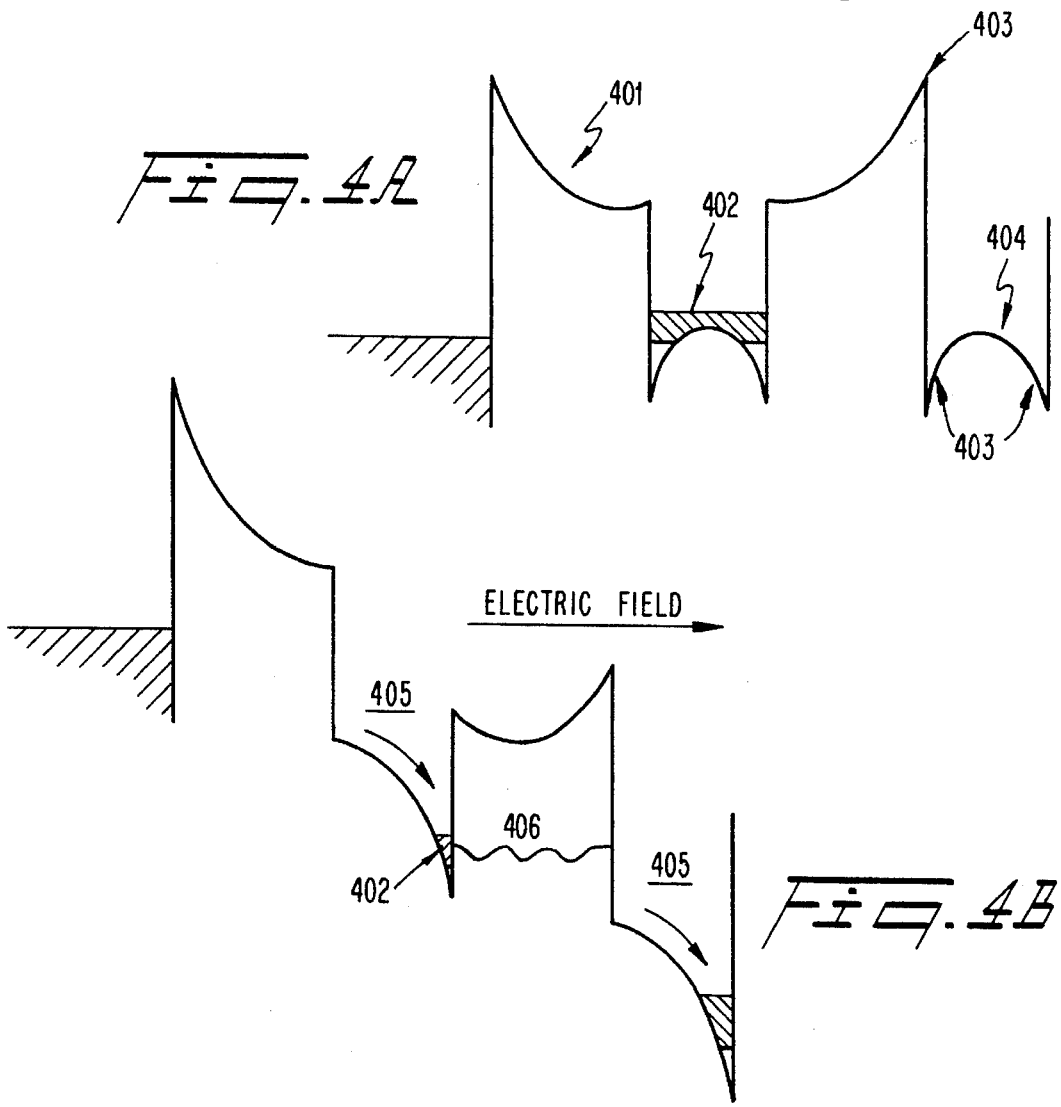

FIG. 7E
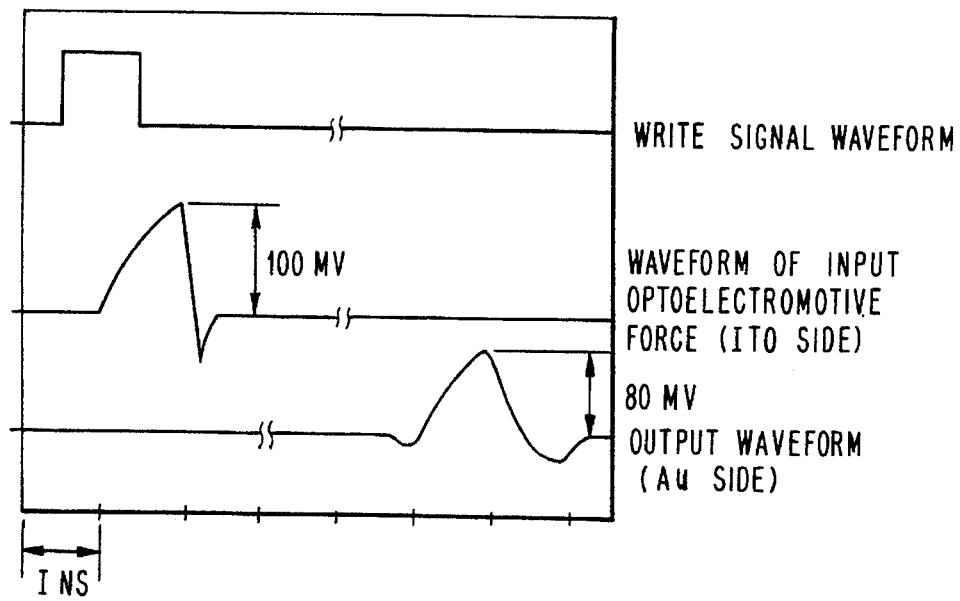
WRITE SIGNAL WAVEFORM
WAVEFORM OF INPUT
OPTOELECTROMOTIVE
FORCE (ITO SIDE)
OUTPUT WAVEFORM
(Au SIDE)
FIG. 7F
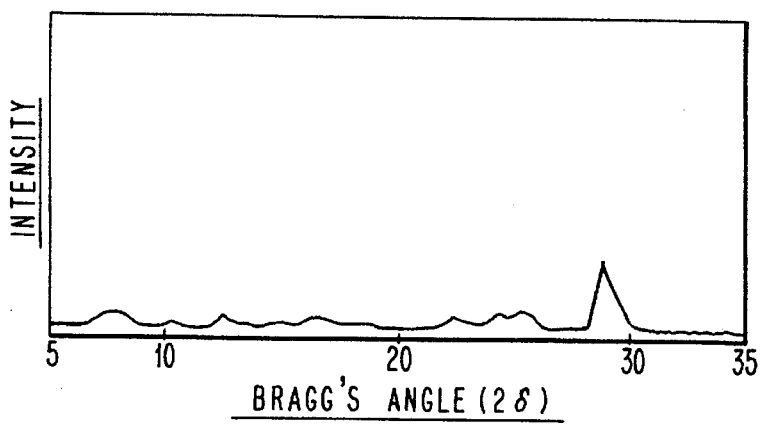
BRAGG'S ANGLE ($2\delta$)
FIG. 7G
WAVE NUMBER ($CM^{-1}$)

801 802 803

(PNP, NPN)

801 802 803

801 802 803

801 802 803

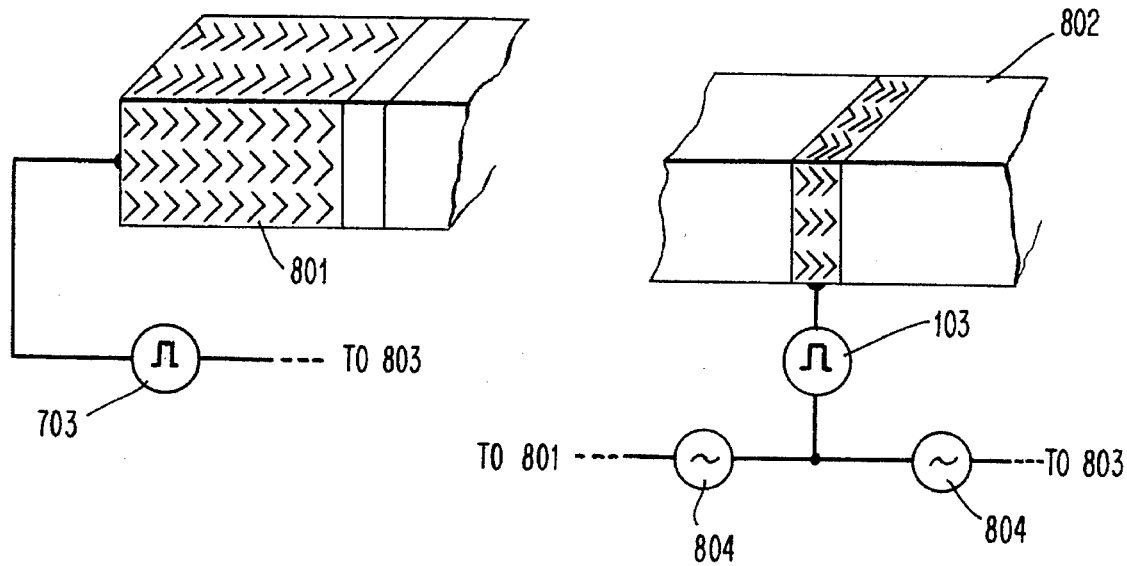
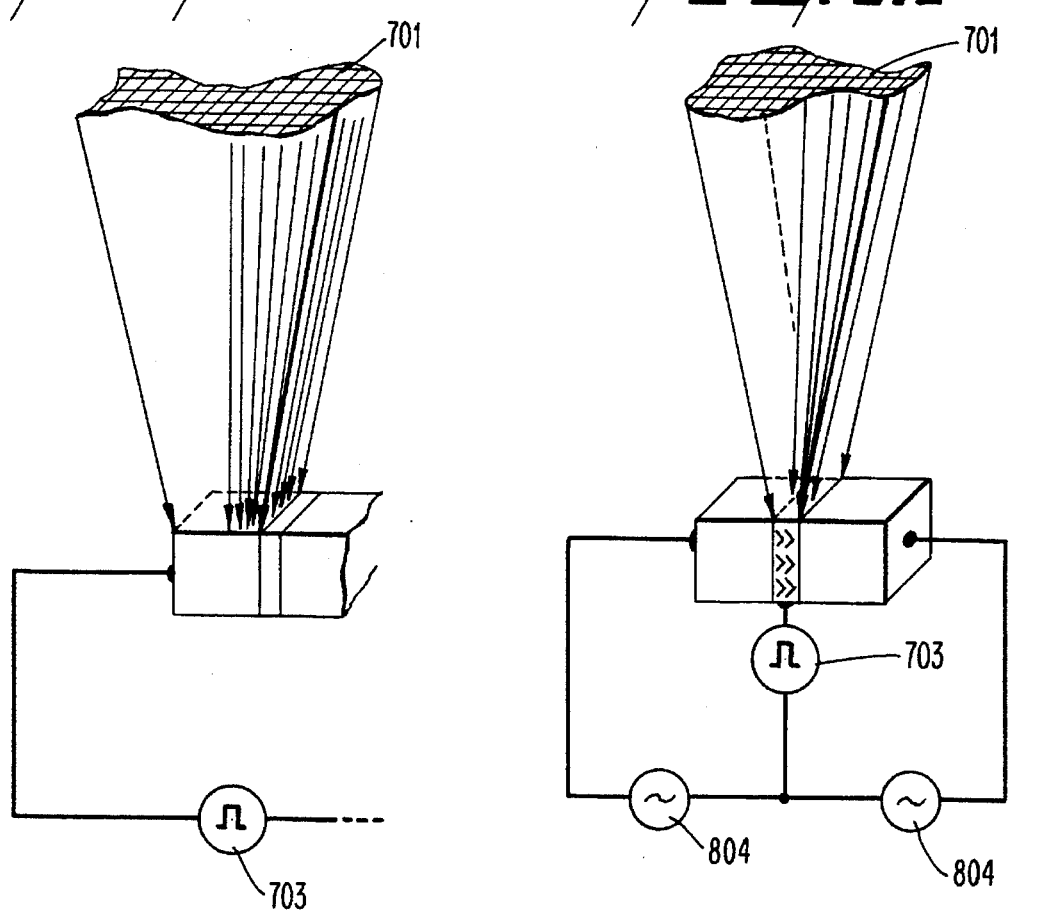

ORGANIC QUANTUM SEMICONDUCTOR AND QUANTUM SEMICONDUCTOR DEVICE

This application is a continuation of application Ser. No. 08/101,819, filed Aug. 4, 1993, abandoned, which is a continuation of application Ser. No. 07/713,777, filed Jun. 12, 1991, abandoned.

FIELD OF THE INVENTION

The present invention relates to a mesoscopic semiconductor material with a multi quantum well structure, and a semiconductor device comprising the same.

DESCRIPTION OF THE RELATED ART

Inorganic semiconductors, which are of Si, GaAs, etc., are typical conventional semiconductors.

Inorganic semiconductors each have a crystal structure wherein the atoms are regularly arranged in a 3-dimensional lattice. Therefore, the energy band of such an inorganic semiconductor is broadly distributed therein two or three dimensionally. This imposes a restriction upon the migration of carriers, so that the carriers cannot migrate other than in a wave packet with great dispersion power. In other words, the carriers undergo restrictions over their mobility and life time. These restrictions deteriorate the S/N ratio, frequency characteristics, switching characteristics, etc. of devices fabricated from such inorganic semiconductors. As a solution to such problems, inorganic semiconductors, particularly, quantum semiconductors mainly of GaAs and GaAlAs, have so far been taken into account. These quantum semiconductors have a so-called quantum well structure with super thin semiconductor crystalline films laminated in a size that ensures the quantum size effect. The entity of the quantum well structure has been confirmed both theoretically and experimentally. Regrettably, however, the localization of the energy band undertaking the migration of carriers, using the quantum well structure has not yet been achieved. The quantum wire proposed to realize the quantum well structure in a lower dimension encounters at the stage of a quantum dot theory such an unnegligible difference from the theoretical value of the quantum well structure, which stems from the inherent crystallinity of inorganic semiconductors. It is therefore difficult to achieve the quantum wire or the quantum dot.

Further, from the viewpoint of semiconductor devices, there are a p-n junction type bipolar element and a MOS (Metal Oxide Semiconductor) device with inorganic semiconductors.

These semiconductor devices are basically of a 3-terminal type (an emitter, a base, and a collector, for example), each requiring due wiring in addition to its intrinsic function. Though they have their necessary wiring installed, using an alloy, such as Al—Cu, with emphasis placed on minimizing the resistance of the wiring and the migration resistance thereof, the attempt to integrate a vast number of 3-terminal type devices into an LSI-ULSI architecture comes across a problem concerning the area ratio of the wiring to the overall area of the chip. This problem concerns some measures to be taken against an increase in the wiring resistance, in an inevitable floating (parasitic) capacity produced between devices, heat accumulated within the devices, and so forth. In the case where many bipolar elements are integrated into the LSI-ULSI architecture, it is necessary to lessen the device size, or provide a large current flow to assure an intensive electric field or a high current density so that each device may be driven at a high speed. Further, in the light of the surface passivation film, etc., each device within an LSI architecture should have the wiring installed 1 to 2 μm thick or thinner. To assure the mentioned electric field or current density, therefore, it becomes necessary to increase the width of the wiring, thus limiting the minimum area allowable for the wiring to occupy in the chip. Specifically, the practical in-chip wiring area ranges from 50 to 70%. Further, with a high-speed LSI, to release the energy (which will finally be converted into heat) consumed in each device, which should cope with the inter-element heat deposit, it is necessary to provide a certain gap between any two neighboring devices as the electric field or current density (ECL, for example) becomes higher. This necessity increases the total wiring length (area), thus impeding fabrication of an LSI. It is likewise necessary to isolate one device from another to a certain degree (device isolation) in order to prevent an inter-element interference due to the floating (parasitic) capacity. This inevitably increases the total wiring length (area). It must be noted that the increases in wiring length, wiring resistance, and floating (parasitic) capacity result in an increase in the CR time constant between devices, thus impeding the aforementioned high-speed operation.

As explained above, the total length (area) of inter-element wiring, floating (parasitic) capacity, and inter-element thermal deposit are issues to be considered in ensuring faster LSI-ULSI.

Further, these issues also remain unsettled for the aforementioned inorganic quantum semiconductors. Fabricating each semiconductor device in a size of a nanometer scale is found serviceable to drive the device at a higher speed, with an undesirable increase in the floating capacitance. Likewise, the nanometer scale introduction in the fabrication of devices wall further increase the wiring area on the chip.

The above are the issues which the conventional semiconductors, and those devices comprising the same should be confronted.

Next, some issues associated with the LSI architecture having the conventional semiconductor devices (3-terminal devices) integrated on a chip, will be described hereunder, with a switching (digital) device taken up as an example, which is currently a mainstream among various types. The information space which the switching element can handle is of a binary (0,1) coded notation. In the case where the information comes in an n-bit data structure, the information space available is $(0, 1)^n$. Such an information space characterizes not only robustness but also simple and easy-to-handle logical structure. Further, the required characteristics of the semiconductor devices are likewise simple. In the meanwhile where it is desired to use such semiconductor devices to realize higher-order data processing, such as what is normally undertaken in a human brain for association, learning, memorizing, and so forth, the information space needed for the task is very large (=analog level). The presentation of such higher-order information in the binary notation requires that "n" should be greatly increased (as much as ∞, theoretically), so that it is impractical. The low-density of the information space undesirably increases the number of data buses, data transfer time, infer-element data communication frequency, and so forth, for data communications between each two devices. This in turn gives rise to a problem with the LSI over the rise of communication cost per capacity of data processing (corresponding to the fall in data processing capability), and the rise of the energy consumption in data communications as well.

Now, the issue concerning the architectures of the information processing devices (CPU, MPU), each using the above-described LSI will be described. The information processing device architecture available today comprises a serial configuration made up of a CPU/MPU (data processing unit)+registers (temporary storage unit)+a memory (input storage unit). The same is true of the configuration of the CPU/MPU unit. Information processing is basically done mainly in one data processing unit while the temporary storage unit coupled to the data processing unit through the data bus is used at a low frequency contrary to the ratio of a large number of its circuitry elements to the number of the entire elements in the LSI. For a secondary storage unit having 3 to 5 fold greater elements in each it is significant to note that the number of times the storage unit is accessed is about 1 to 10 times per one data processing done by the data processing unit. That is, the storage unit is hardly considered active as its frequency of use is $10^{-6}$/sec. At present, as a solution to this shortcoming, a parallel (pipeline, array) processor has been proposed. Regrettably, however, the information processing device architecture is basically of the series configuration as remarked above, whereby no processor practically goes beyond the conventional framework of series data processing, with the issue concerned remaining unsettled. The organic quantum semiconductor to be provided according to the present invention enables fabrication of such a data processing device which can achieve a non-Neumann type architecture with feasibility for super parallel data processing, extra dispersion power, and ultra high information density to solve a variety of problems around not only those information processing devices (LSI) derived of the conventional semiconductors referred to above but also the Neumann type data processing theory.

Further, the organic quantum semiconductor device according to the present invention can provide the aforementioned high-order information processing means based on the non-Neumann type architecture.

SUMMARY OF THE INVENTION

It is therefore an object of the present invention to provide an organic quantum semiconductor, which can overcome the above-described problems.

This object is achieved by the following organic quantum semiconductor and quantum semiconductor devices.

(1) According to one aspect of the present invention, there is provided an organic quantum semiconductor comprising at least two kinds of organic semiconductor layers with different band gaps, laminated in a super thin film configuration in a specific order for at least one cycle of run, so as to have a multi quantum well structure wherein multiple quantum wells are laminated one on another.

(2) It is preferable that the organic quantum semiconductor has at least one of a tunnel structure, semiconductor band structure, elementary excitation structure, superconducting structure, quantum hole structure, resonance structure, quantum sealed-off structure, hetero-structure, coulomb blockade structure, and Schottky structure in a portion of the multi quantum well structure which corresponds to at least one cycle of run.

(3) According to another aspect of the present invention, there is provided a quantum semiconductor device comprising the organic quantum semiconductor as recited in paragraph (1) or (2) having an organic molecular semiconductor consisting of a one-dimensional electric or at least one of the one-dimensional electric conductor, a two-dimensional electric conductor, a one-dimensional photoconductor and a two-dimensional photoconductor and aligned in a direction along a gate field within at least one of a source layer, a drain layer and a channel layer of a MOSFET structure.

(4) According to a different aspect of the present invention, there is provided a quantum semiconductor device comprising the organic quantum semiconductor as recited in paragraph (1) or (2) having an organic molecular semiconductor consisting of at least one of a one-dimensional electric conductor, a two-dimensional electric conductor, a one-dimensional photoconductor, and a two-dimensional photoconductor and aligned perpendicular to a gate field within a gate layer of a MOSFET structure.

(5) According to a further aspect of the present invention, there is provided a quantum semiconductor device comprising the organic quantum semiconductor as recited in paragraph (1) or (2) having an organic molecular semiconductor consisting of at least one of a one-dimensional electric conductor, a two-dimensional electric conductor, a one-dimensional photoconductor, and a two-dimensional photoconductor and aligned in a direction along an electric field in a diode.

(6) According to a still further aspect of the present invention, there is provided a quantum semiconductor device comprising the organic quantum semiconductor as recited in paragraph (1) or (2) having an organic molecular semiconductor consisting of a one-dimensional electric conductor, a two-dimensional electric conductor, a one-dimensional photoconductor and a two-dimensional photoconductor aligned along an electric field to be applied between an emitter and collector of a transistor in at least one of a base layer, emitter layer and collector layer thereof.

(7) According to a yet still further aspect of the present invention, there is provided a quantum semiconductor device comprising the organic quantum semiconductor as recited in paragraph (1) or (2) having an organic molecular semiconductor consisting of at least one of a one-dimensional electric conductor, a two-dimensional electric conductor, a one-dimensional photoconductor and a two-dimensional photoconductor and aligned perpendicular to an electric field to be applied between an emitter and collector of a transistor within a base layer thereof.

BRIEF DESCRIPTION OF THE DRAWINGS

FIGS. 1 to 4 are diagrams for explaining the action of the present invention;

FIGS. 7A to 7G are diagrams illustrating the third embodiment of the present invention;

FIGS. 8A to 8L are diagrams illustrating the fourth embodiment of the present invention.

DETAILED DESCRIPTION OF THE PREFERRED EMBODIMENT

The organic quantum semiconductor which the present invention aims to provide, renders practicality to fabricate a data processing device with feasibility for super parallel processing, super dispersion power, and ultra high information density. How the organic quantum semiconductor works for such feasibility as referred to above is described hereunder.

Compared with the inorganic semiconductors, the first feature of the organic semiconductor according to the present invention lies in its crystal structure. The organic semiconductor characterized by a molecular crystal provides greater electro-optical anisotropy, as compared with the inorganic semiconductors. To achieve sufficiently large electro-optical anisotropy as required, the organic semiconductor according to the present invention is processed into an extra thin film with a thickness ranging from several tens to several hundred angstroms, with a one-dimensional superlattice formed therein.

Figure 1:
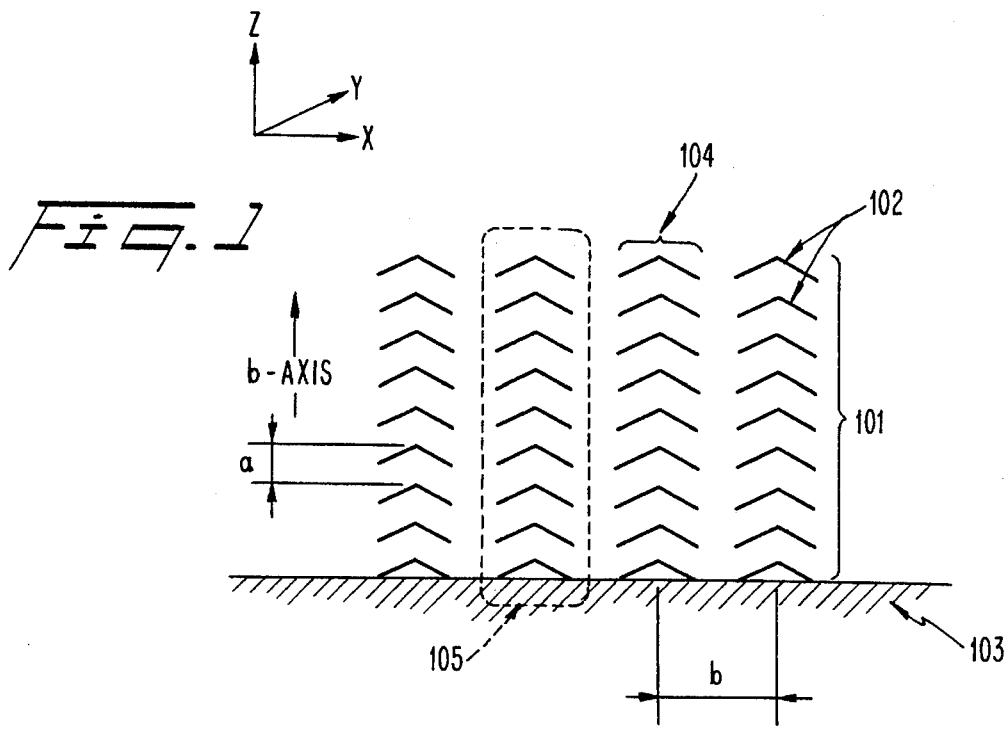

FIG. 1 shows a one-dimensional superlattice structure. The organic quantum semiconductor is of the molecular crystal wherein molecules are columnarly stacked one over another in a crystal-axial direction (b-axis) as shown in FIG. 1. Referring to FIG. 1, the superlattice is found with four columns 104 formed herein, each comprising nine molecules 102 columnarly stacked together on substrate 103. Where a plurality of molecules 102 are stacked together into the column 104, the intermolecular axial gap (a) is as slight as a few angstroms, with each two neighboring molecules arranged very close to one another, whereby in a mesoscopic domain, there is produced a quantum effect. It is inferred that the columnar configuration of a plurality of molecules 102 concurs with their individual $\pi$ electron systems lapped over one another, resulting in the coexistence of the $\pi$ electron systems' respective wave functions, whereby a quantum tunnel effect is yielded to provide a conjugated intermolecular electron orbit within the entirety of each molecular column. On the other hand, between each two neighboring molecular columns, there exists an inter-column gap (b) of more than 10 angstroms, whereby no such a quantum effect as remarked above is produced, thus providing no conjugated intermolecular electron orbit. Namely, in the one-dimensional superlattice structure in FIG. 1, a quantum wire 105 is configured with the molecules 102 stacked together into the column 104, thus facilitating the migration of electrons in the axial direction due to the electro-optical anisotropy and the quantum semiconductor effect.

Figure 2:
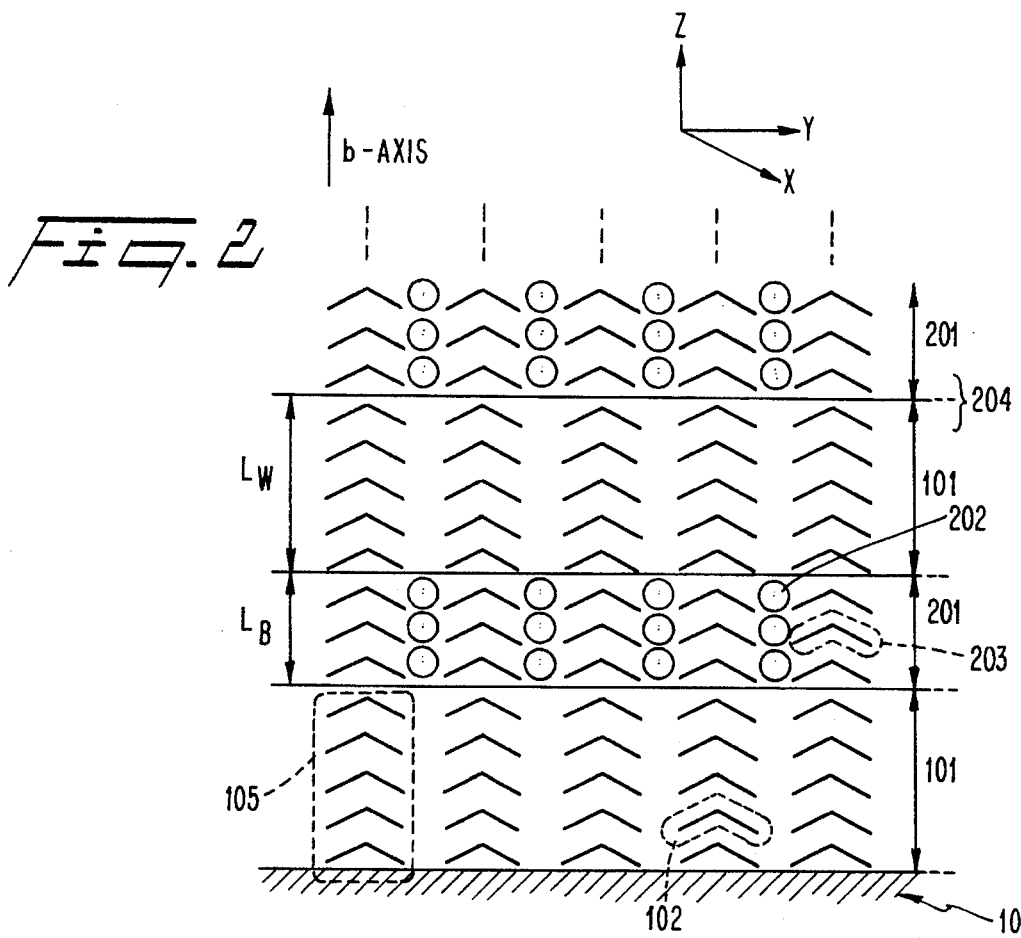

In the next step, a second thin film is formed on (in the succeeding stage) the surface of the one-dimensional superlattice structure 101. FIG. 2 shows an overall structure wherein the second thin film is lapped over the one-dimensional superlattice structure, the second thin film being fabricated from one of a metal, an organic semiconductor, an organic conductor, and so forth. At the interface between the first-mentioned thin film and the second thin film, there is formed a hetero-junction layer 204. Where the second film is derived of an organic semiconductor, stacking together the molecules 102 into the column with the Schottky junction characteristic taken into account, namely within the one-dimensional superlattice structure 101 yields the quantum wire 105 to thereby form a multi quantum well (MQW) structure. This facilitates the migration of electrons in the axial direction due to the electro-optical anisotropy and the quantum semiconductor effect.

The first thin film has the one-dimensional superlattice 101 as described above. Likewise, the second thin film is also configured to have a superlattice 201 using molecules 203. The molecules of the organic semiconductor in the superlattice 201 may be aligned in the same way as those in the one-dimensional superlattice 101. In addition, properly selecting the molecular structure of the organic semiconductor and the dopant material 202 can add a two-dimensional expansion to the one-dimensional structure. This option may be added as needed in accordance with the required information processing function.

FIG. 3 exemplifies the energy band structure of the MQW in the hetero-junction of the superlattices 101 and 201. The energy gap $E_{g1}$ shows the energy difference between a filled band and a conductive band of the aforementioned conjugated electronic system in the superlattice 101. Likewise, $E_{g2}$ represents the energy difference between the bands in the superlattice 201. With $\phi_c$ and $\phi_v$ being the work functions of the conductive band and filled band of each superlattice, it is necessary to adjust $\phi_c$ and $\phi_v$ for the superlattices 101 and 201 so as to satisfy the following:

$$\phi_{c2} > \phi_{c1}, \phi_{v1} > \phi_{v2}$$

where $\phi_{c1}$ and $\phi_{v1}$ are work functions for the superlattice 101, and $\phi_{c2}$ and $\phi_{v2}$ are work functions for the superlattice 201.

Referring to FIG. 3, $\Delta E_c$ is the height of the barrier for the conductive band in the hetero-structure and is given by:

$$\Delta E_c \approx \phi_{c2} - \phi_{c1}$$

Likewise, $\Delta E_v$, which is the height of the barrier for the filled band, is given by:

$$\Delta E_v \approx \phi_{v1} - \phi_{v2}$$

"$L_B$" is the thickness of the superlattice 201, and "$L_W$" the thickness of the superlattice 101.

In The MQW structure shown in FIG. 3, the superlattice 101 is a well and the superlattice 201 serves as a barrier. Applying an electric field to the MQW can incline the MQW structure as illustrated. FIGS. 4A and 4B illustrate the migration of carriers in the MQW structure. FIG. 4A shows the localization of charges when no external electric field is applied to the normal MQW. Referring to FIG. 4A, information carriers 402 can be localized in a well 404. The localization can be realized by providing quantum wave mechanic matching of the size of the well and the sub band formed therein with the wave motion of the wave packet the information carriers have.

FIG. 4B illustrates transfer of the information carriers 402 to an adjoining well. Applying an electric field to the illustrated MQW structure can ensure the lateral energy state as shown in this diagram. Proper selection of the electric field or quantitatively causing the potential difference to individual sub bands 405 formed in the respective wells 404 by an electric field permits the information carriers 402 to be transferred to an adjoining well through a tunneling 406. A material used for molecules 102 and 203 which form the above-described organic semiconductor layer is properly selected according to the applications among the well-known organic semiconductor materials disclosed in, for example, the following documents:

Organic Semiconductors (F. Gutmann, et al., R. E. Krieger Publishing, 1981)

Organic Semiconductors (H. Meier, verlag Chemie, 1974)

Phthalocyanines (C. C. Lezuoff, et al., VCH Publishers, 1989)

The Phthalocyanines (F. H. Moser, et al., CRC Press, 1983)

Coordination Compounds of Porphyrins and Phthalocyanines (B. D. Berzin, John Wiley, 1981)

Molecular Crystals and Molecules (KITaigorodsky, Academic Press, 1973)

Electrical Transport in Solids (Kao, et al., Pergawon, 1981)

Conductive Polymers (R. Seymour, Plenum Press, 1981)

Electronic Processes in Organic Crystals (M. Pope, et al., 1982)

Organic Molecular Crystals (E. A. Silish, Springer, 1980)

The material for the superlattice 201 can be acquired by doping ionic materials, such as iodine, and complex forming materials, in addition to those of the prior art. Further, the material for the superlattice 201 may be properly selected so as to provide a hetero-junction, using known organic conductive materials and inorganic thin films disclosed in the above-referenced documents various materials described above may be properly combined for each of an interface layer, a barrier layer, and an injected epitaxial substrate layer.

As a thin-film forming method, well-known methods may be used: a dry process, such as a vacuum deposition-ion plating method and a sputtering-MBE method, and a wet process, such as a casting-LB method.

The thickness of the superlattice 101, $L_W$, has only to be the size that forms the quantum wire, for example, about 20 to 100 angstroms. This is because in the proximity of 100 angstroms, the mean free path in the conductive band formed by the π electron system and $L_W$ can be set less than about the mentioned size, thus ensuring very high electron migration.

With regard to the second superlattice 201 using organic semiconductor molecules 203, it is preferable to use organic semiconductor materials of the same system as that of the superlattice 101, with physical or chemical modification done thereto by doping because this process facilitates continuity of the axes of the superlattices 101 and 201. The resultant semiconductor has such properties as to ensure the designing of the work function φ of each layer, the lattice constant energy gap $E_g$, $\Delta E_c$ in the conductive band, $\Delta E_v$ in the filled band, etc. For instance, if $L_W$ is set as thick as $L_B$ and the superlattice 201 is designed to have the same quantum wire structure 105 as the superlattice 101, $\Delta E_c=10$ to 100 meV, $\Delta E_v=10$ to 500 meV, and $E_{g2}=500$ to 2000 meV, and the aforementioned MQW can be formed.

The semiconductor to form such a MQW may be applied to any of the prior art semiconductor devices. For example, as operation modes, various opto-electronic operation modes, such as unipolar, bipolar, thyristor, opto-electromotive force, photoconductor, and photolinear modes, are available which have been considered for inorganic semiconductors, such as Si, Ge and GaAs. As a device structure, various structures are available, which include a MOSFET structured Schottky structure, hetero-structure, MQW structure, transistor structure, PET structure, photodiode structure, phototransistor structure, hetero-bipolar transistor structure, resonance tunnel diode structure, hot electron transistor structure, resonant tunnel transistor structure, superlattice hetero-structure avalanche photodiode structure, and photoresonant etalon structure, which have been considered for inorganic semiconductors, such as Si, Ge and GaAs.

This organic semiconductor has many quantum wells, and can form a quantum wire and quantum dots having a columnar structure. The use of such a quantum wire with the MQW structure can transfer information carriers (electrons/holes) and ensure execution of an arithmetic operation. That is, a single MQW quantum wire of the mentioned type corresponds to an independent information processing unit (specifically, one transistor). According to the MQW structure of the present invention, the one-dimensional superlattice 101 mainly executes transfer and latching (storing) of information carriers, while the superlattice 201 can perform an arithmetic operation on the information carriers.

This feature can totally eliminate the electric wiring that is essential in the conventional LSI structure using three-terminal transistors of Si or GaAs. Further, with regard to the size of the device unit, as compared with transistors using superlattice thin films of Si or GaAs, it is possible to fabricate a very small information processing unit of the same size (1000 angstroms) or smaller. With information processing units fabricated in parallel at the pitches of 20 to 1000 angstroms, the device density is about $10^{18}$ to $10^{12}$ per square meters, $10^6$ to $10^4$ higher than the integration density of the conventional LSIs. The present device can ensure arithmetic operations of cranial nerves within the device in addition to the super high density and super parallel structure. With attention paid to the quantum wire where the superlattice 201 is present, for instance, with respect to a group of information carriers transferred from the superlattice 101 in the previous stage, the quantum is added with the interaction of the information carriers directly transferred to the wire and the information carriers of the quantum wire in the proximity of the n-th quantum wire.

(Embodiment 1)

Figure 5:
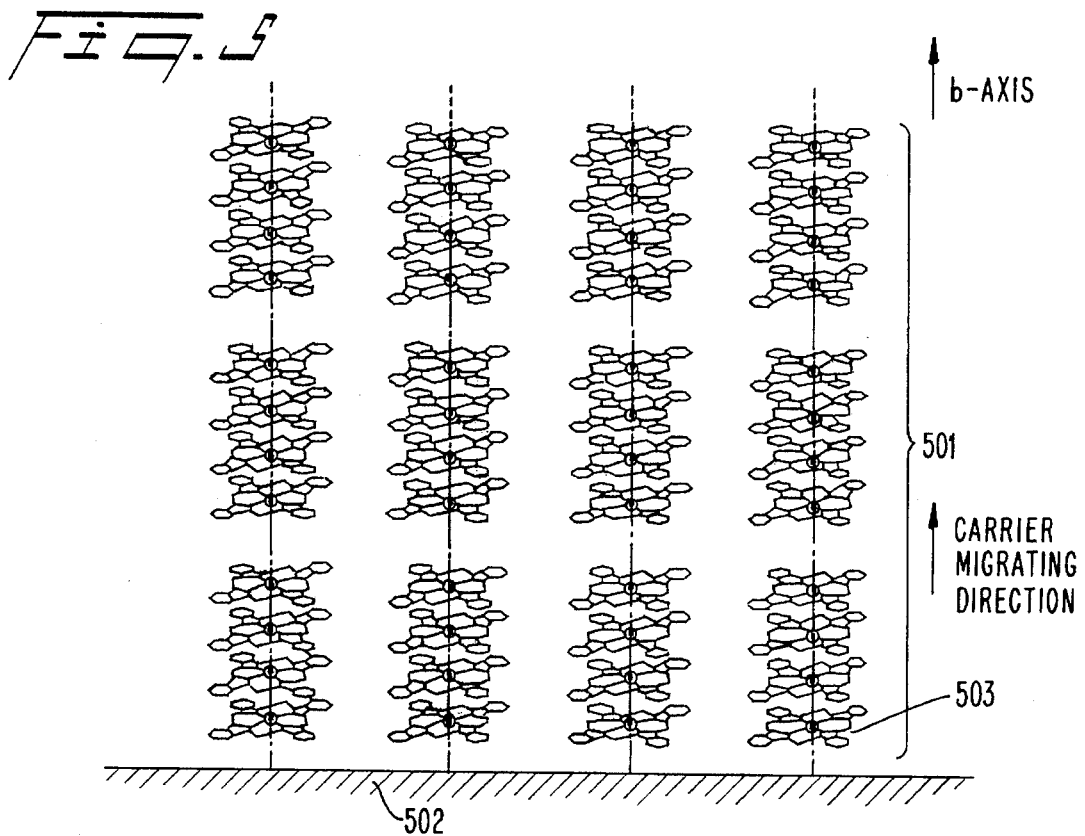
FIG. 5 is a diagram illustrating the first embodiment of the present invention.

FIG. 5 illustrates the first embodiment of the quantum wire. According to this embodiment, phthalocyanine molecules 503 were deposited on a substrate 502 in the vertical direction (b-axis). Using MBE and ALE apparatuses in this embodiment, approximately thirty layers (≈100 angstroms) were deposited at the speed of about 1 angstrom per two to five minutes under vacuum pressure of $10^{-8}$ to $10^{-10}$ Torr and at the substrate temperature of 200° to 300° C. The length the wire 501 was therefore about 100 angstroms. Further, through the STN observation, the pitch between the wire 501 was confirmed to be about 20 to 100 angstroms. The mobility μ of electrons across this wire showed 1 to 400 cm$^2$/Volt/sec. This value μ was realized $10^4$ to $10^6$ as great as the mobility of conventional chain organic molecules. It is apparent from this matter that the quantum wire is structured as a device in the molecule structure according to this embodiment.

(Embodiment 2)

Figure 6:
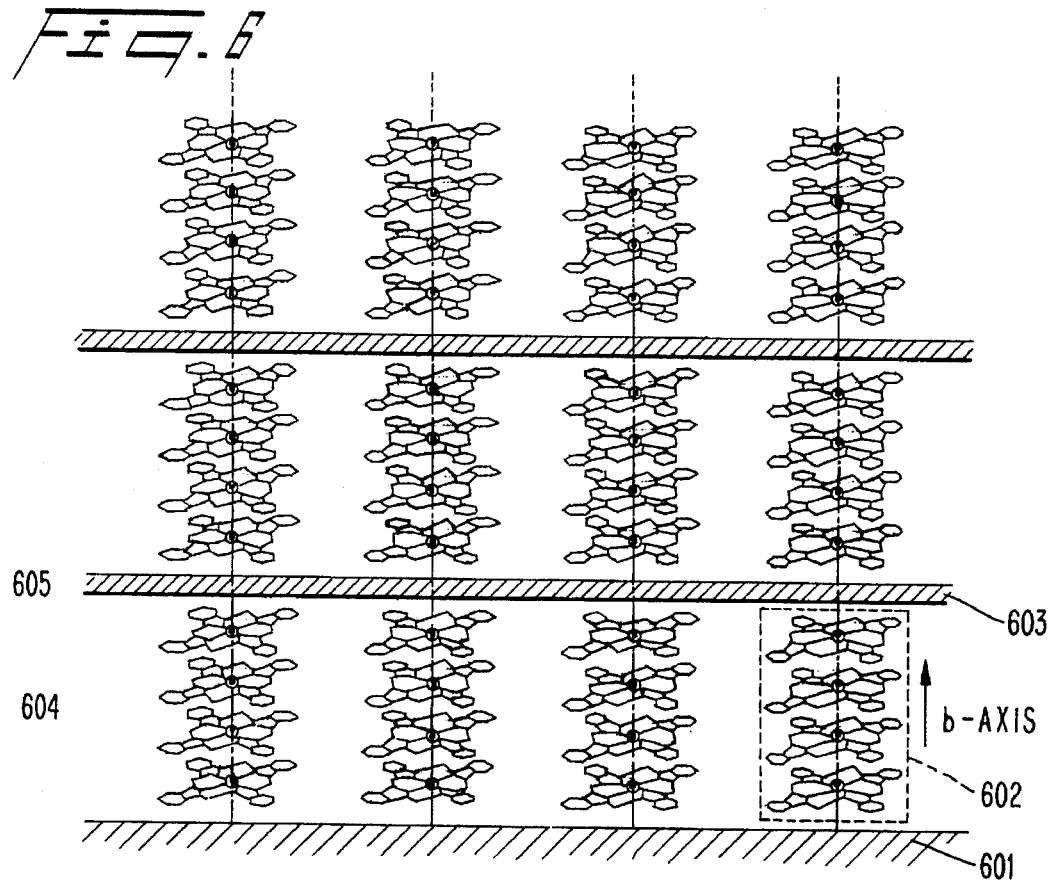
FIG. 6 is a diagram illustrating the second embodiment of the present invention.

FIG. 6 shows the second embodiment of quantum dots. A Si substrate was used as a substrate 601. The phthalocyanine molecules as described in the section of the first embodiment were vapor-deposited using the MBE or ALE apparatus. The vapor deposition conditions were the same as those in the first embodiment. The quantum dote were interrupted by a hetero layer 603 as a barrier. The energy state at this time was a so-called MQW structure, as illustrated in FIG. 3. By doping iodine into the phthalocyanine molecules was realized the hetero layer 603 with its thickness $L_B$ of 10 to 100 angstroms, for transferring carriers to an adjacent well 604.

(Embodiment 3)

FIG. 7 illustrates the third embodiment of a photoconductive diode device using the organic quantum semiconductor according to the present invention. Oxytitanyl phthalocyanine was vapor-deposited on a gold-deposited light-transmitting glass substrate in the vacuum under the pressure of $10^{-7}$ Torr, providing a thin film of 120 angstroms. As the result of analyzing this film by X-ray diffraction and the FT-IR measurement, it was confirmed that the crystal axis (b axis) of the phthalocyanine was set in direction intersecting the substrate. Next, the oxytitanyl phthalocyanine was deposited 20 angstroms on a light-transmitting glass substrate 702 with an ITO electrode 705 in the same manner, and the oxytitanyl phthalocyanine was further deposited 120 angstroms thick. Gold was then vapor-deposited atop as an electrode 704, providing a semiconductor diode device shown in FIG. 7A. In order to evaluate the optical and electric characteristic of this device, a sync pulse 703 is applied between the ITO 705 and the Au electrode 704 as shown in FIG. 7A. Then, optically writing information shown in FIG. 7E was written as a luminous flux from the ITO 705 simultaneously and in parallel (see FIG. 7D). The quantum wire of this embodiment has the Ti-phthalocyanine one-dimensional photoconductive characteristic.

According to this embodiment, the columns of the quantum wires were arranged by the 20-angstrom pitches, but optical writing was performed by the 1-μm pitch. In other words, 500×500 (=25×10$^4$) fluxes were considered to be one unit (one bit). An optical writing signal was input as a pulse column in association with the sync pulse 703. The wavelength λ of the semiconductor laser at this time was 780 nm, the writing cycle was 500 MHz, and the writing energy was 20 pJ/cm$^2$. The parallel processing could be performed with the density of 25×10$^6$ bits/mm$^2$ in the valid writing cross section of the device, 5×5 mm$^2$. The environment for transferring the sync pulse 703 at this time was 10$^{5v}$/cm and the pulse width was 1 ms. An example of a transferred wave is shown in FIG. 7E. The favorable wave transfer could be done as apparent from the output waveform shown in FIG. 7E.

Figure 7A:
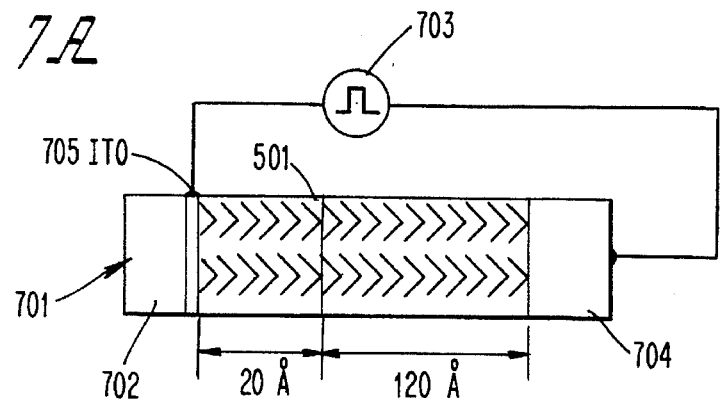
Figure 7B:
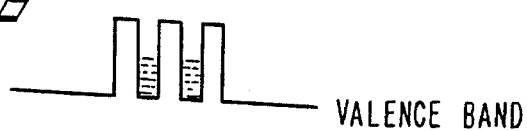
Figure 7D:
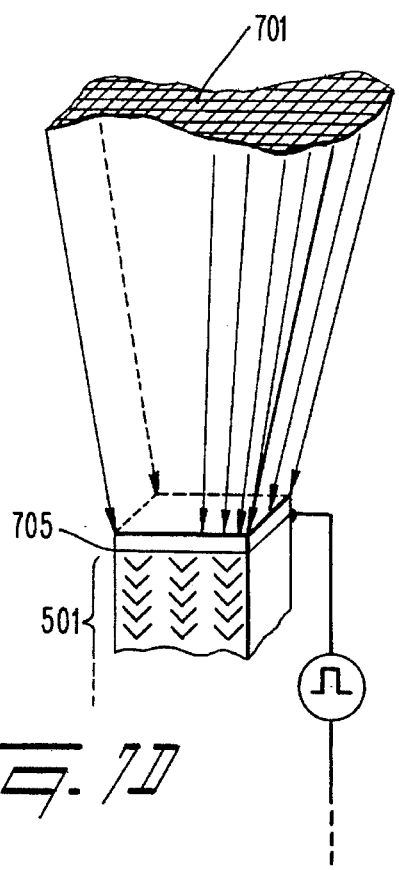
Figure 7C:
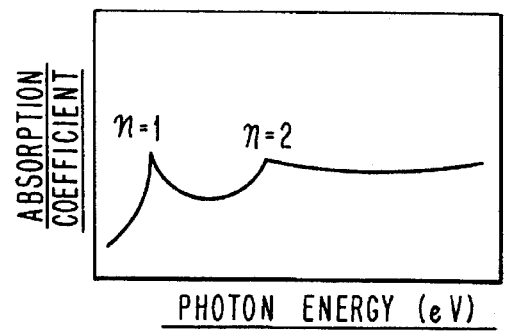

The results of the spectrum extinction measurement, the X-ray diffraction and the FT-IR measurement are represented in FIGS. 7C, 7F and 7G. It is therefore considered that the quantum wire array shown in FIG. 7A and the quantum energy structure shown in FIG. 7B (only a valence band is illustrated in this case) are provided.

Figure 8A:
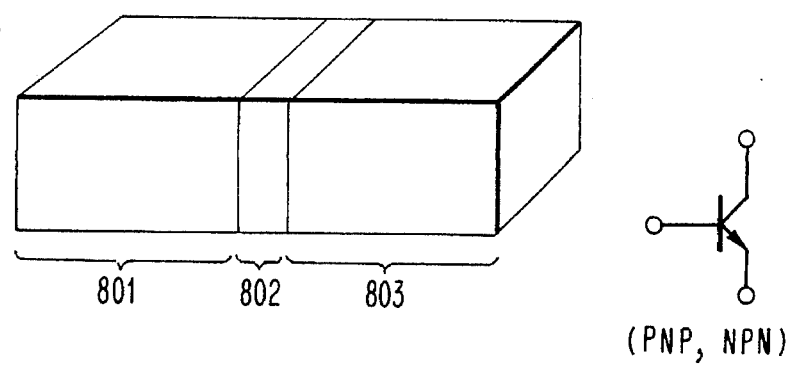
Figure 8B:
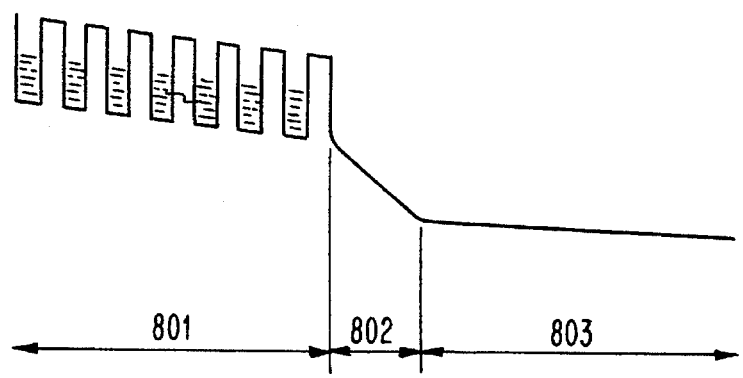
Figure 8C:
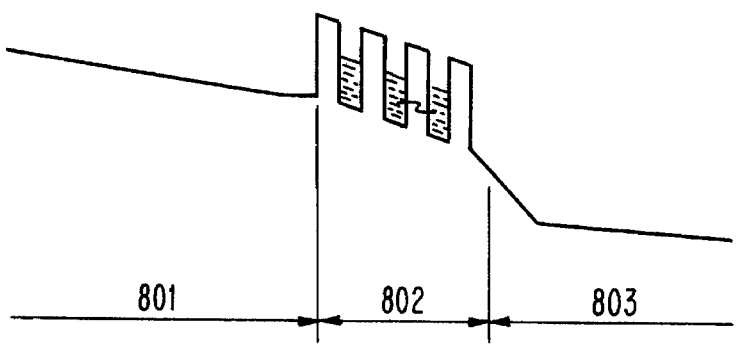
Figure 8D:
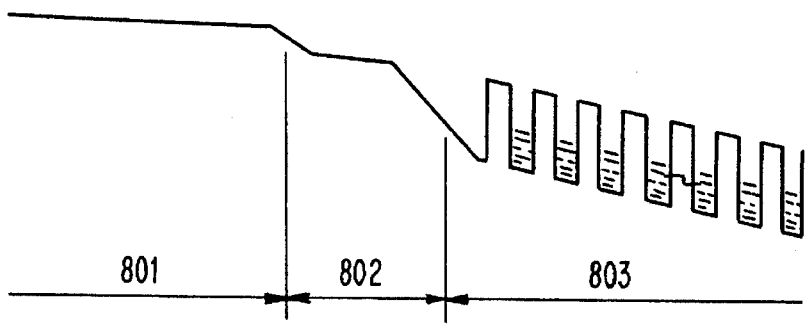
Figure 8I:
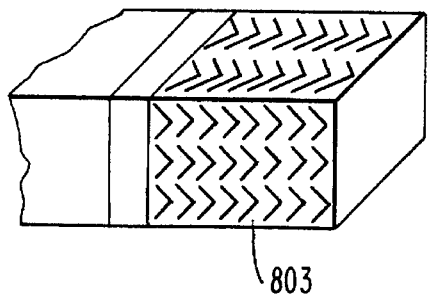

FIG. 8 illustrates the fourth embodiment, according to which an organic quantum semiconductor is used for an emitter layer 801, base layer 802 or collector layer 803 of a transistor device (see FIG. 8A). For other portion than the organic semiconductor portion, the (111) crystal face of Si is used with the fabrication processes used for ordinary inorganic semiconductors. Lead phthalocyanine as the organic quantum semiconductor is vapor-deposited 100-angstroms thick under a pressure of 10$^{-9}$ Torr using the molecular epitaxy method. Pyrazino pyridine is likewise deposited 30-angstroms thick on the resultant structure. Thereafter, five layers of this combination are sequentially formed, thus providing the hetero MQW structure. As discussed in the section of the third embodiment, multi quantum structures as shown in FIGS. 8B, 8C and 8D were confirmed through the absorption spectrum, X-ray diffraction and FT-IR measurement.

Figure 8K:
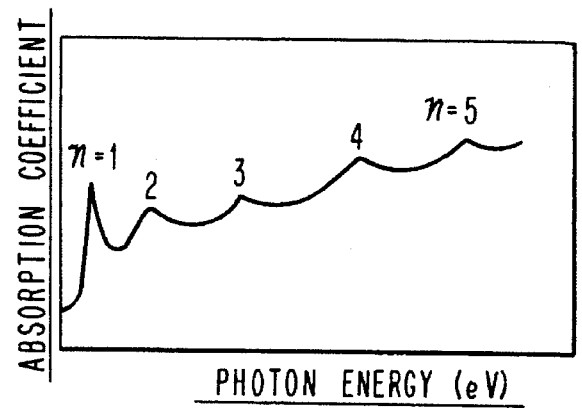
Figure 8J:
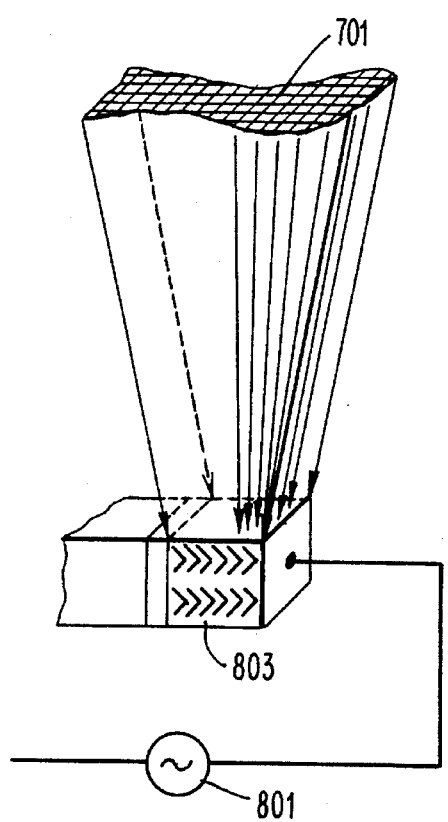
Figure 8L:
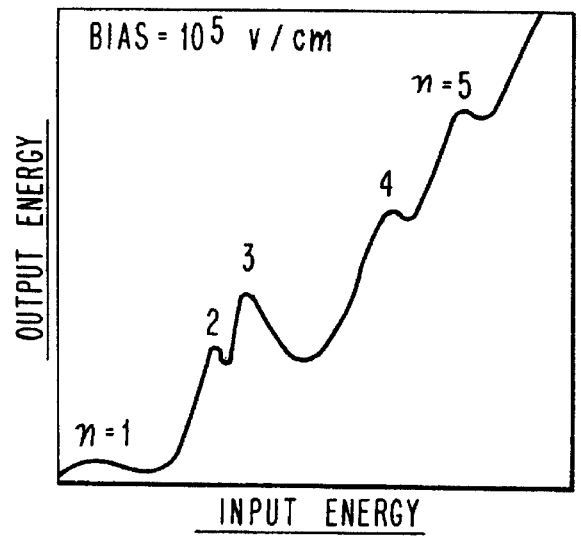

FIGS. 8E and 8F, or 8G and 8H, or 8I and 8J illustrate examples in which photo writing 701 is performed on the emitter 801, base 802 or collector 803, each made of an organic quantum semiconductor. It is possible to provide quantum wires having different electric conductivity in an organic quantum semiconductor in accordance with the photoconductive characteristic of phthalocyanine. Those carriers which produce phthalocyanine are transferred along the quantum wire. At this time, applying a sync pulse 703 is considered to transfer carriers to adjoining mini bands of adjoining wells in the MQW structure shown in FIGS. 8B, 8C or 8D due to the tunnel effect or hopping effect. When no sync pulse 703 is applied, the carriers will be locked in the well. According to this embodiment, with five MQWs, the results of the measuring photoconductive characteristic showed the current/voltage material property of five digits, as shown in FIGS. 8K and 8L. The conditions of the experiment were the same as those involved in the third embodiment.

Figure 9A:
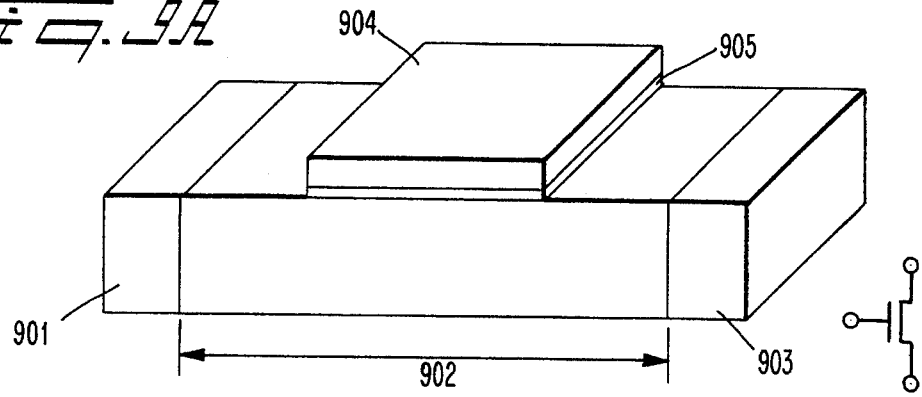
FIGS. 9A to 9G are diagrams illustrating the fifth embodiment of the present invention.
Figure 9B:
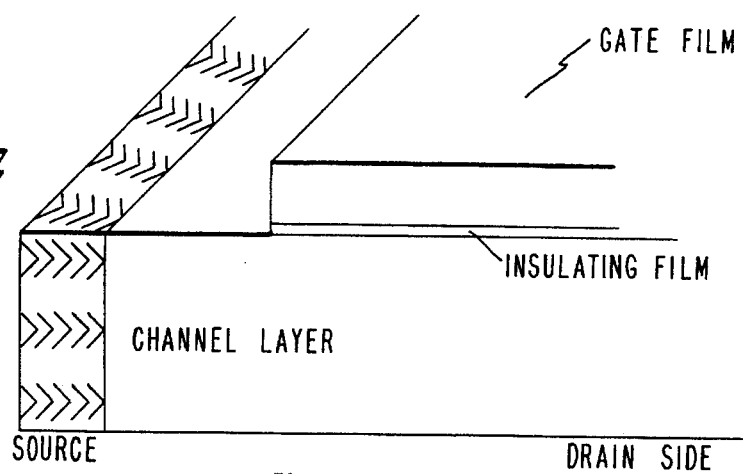
Figure 9C:
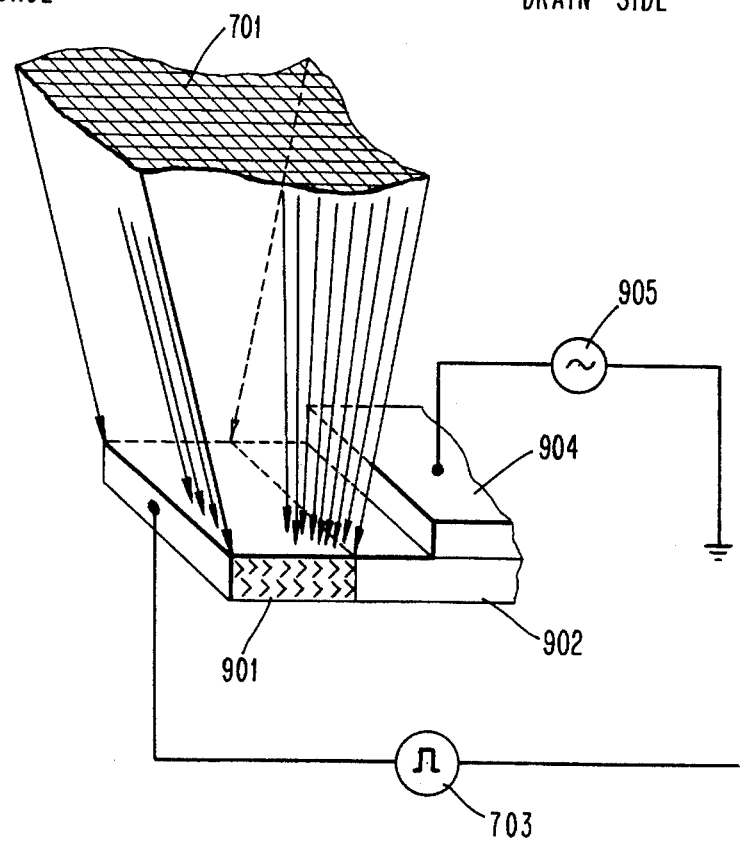

FIG. 9 exemplifies the use of an organic quantum semiconductor for a MOSFET (see FIG. 9A). FIGS. 9B and 9C, and FIGS. 9D and 9E show embodiments according to which a MQW structure comprising an organic quantum semiconductor is used for a source layer 901 and a drain layer 903, respectively. As the organic quantum semiconductor in the embodiments, aluminum phthalocyanine fluoride was cooled to −80° C. and formed into a film with a thickness of 150 angstroms, with the other conditions being the same as those involved in the second embodiment. The produced film was left at the normal temperature in an iodine gas atmosphere for 30 minutes. Phthalocyanine was again vapor-deposited on the resultant structure at a temperature of −80° C., and the resultant structure was subjected to the same iodine processing. The same sequence of processes was repeated three times and finally aluminum phthalocyanine was formed again on the resultant structure, with an aluminum electrode provided therein. These procedures were repeated several times to provide the hetero structure with the desired MQWs. This MQW structure becomes the same energy band structure (see FIGS. 3 and 6) as per the second embodiment, thus providing the aforementioned quantum dots. The photoelectric characteristics were measured in the above-described manner wherein an optical writing signal was added in a pulse form to generate photocarriers, which were transferred using the sync pulse 703 applied between the drain 903 and source 901. Here, applying a gate signal 905 can further modulate the carriers. This modulation method produced the same effect as obtained by the gate signal for a MOSFET, conventionally realized by an inorganic semiconductor.

Figure 9F:
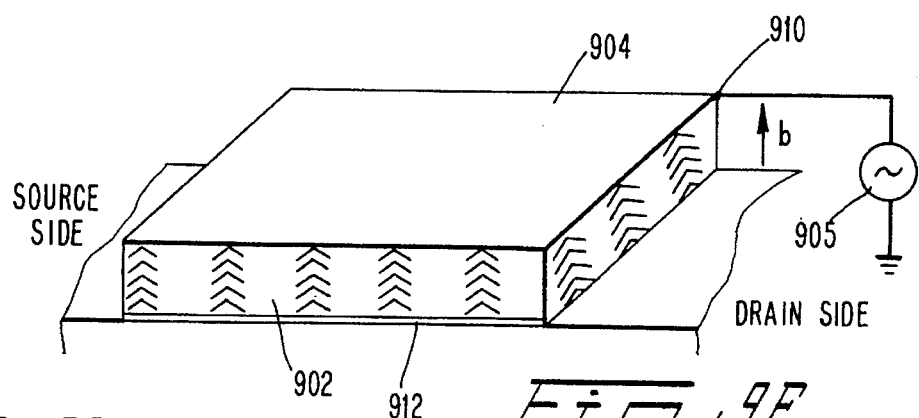
Figure 9D:
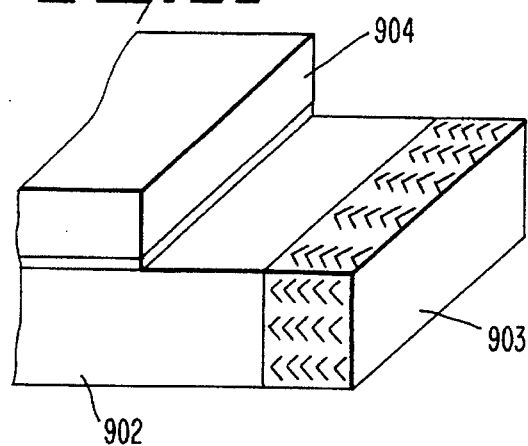
Figure 9G:
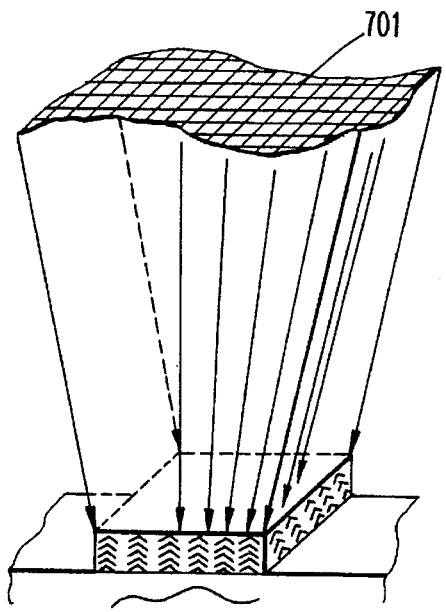
Figure 9E:
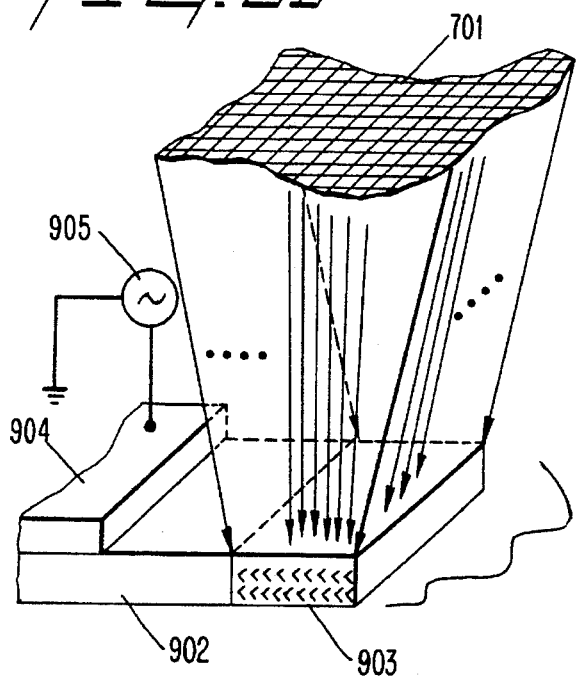

FIG. 9F illustrates an embodiment wherein an organic quantum semiconductor is used for the gate layer 904. The way to prepare it is the same as the one used for the source layer and drain layer. Further, a one-dimensional chain material, which is transparent to the optical writing wavelength λ and has an electric conductive anisotropy along the b axis in FIG. 9F, is used as a gate electrode 910 on the gate layer 904. The photocarriers originated from the optical writing were transferred in the MQWs formed in the gate layer 904 by the application of the sync pulse 905. Further, the carriers could form a two-dimensional multi-voltage distribution (about 0 to 2 V) in the gate layer. The conditions for the optical writing and the sync pulse conformed to those involved in the previous embodiment. The two-dimensional multi-voltage distribution could permit electron gas of the channel layer 902 of the MOSFET to be modulated via an insulating film 912 at the density corresponding to the aforementioned bit density (=1 μm×1 μm). The modulation of electrons in the channel layer, when attention was paid to one bit, was the same as the conventional MOSFET of an inorganic semiconductor, while 25×10$^6$ bits/mm$^2$ of data could simultaneously be written in the gate layer of the size of 5 mm×5 mm. Furthermore, modulating the electron gas injected from the source layer in accordance with this density could realize a parallel arithmetic operation on the same quantity of data, namely, 25×10$^6$ bits/mm$^2$ of data.

As described above, the organic quantum semiconductor according to the present invention can produce multi quantum wells and has the quantum wire structure which ensure excellent multi-structure and higher density as compared with Si or GaAs. This organic quantum semiconductor is a novel semiconductor particularly suitable for use in an information processing device.

What is claimed is:

1. An organic semiconductor, comprising: at least three organic semiconductor layers, each layer being formed by epitaxially depositing molecules of a compound selected from a group comprising phthalocyanine, iodinated phthalocyanine, titanyl phthalocyanine, lead phthalocyanine, aluminum phthalocyanine fluoride, aluminum phthalocyanine, pyrazino pyridine, and porphyrins, to form a super-thin film configuration; wherein two adjacent layers of the at least three organic semiconductor layers comprise different organic semiconductor materials.

2. The organic semiconductor of claim 1, wherein each said super-thin film configuration comprises one-dimensional columns of stacked molecules, said one-dimensional columns being separated respectively from each other.

3. The organic semiconductor of claim 2, wherein at least one of a tunnel structure, semiconductor band structure, excitation structure, quantum hole structure, resonance structure and Schottky structure is further provided in said hetero-junction in the direction of said one-dimensional columns.

4. The organic semiconductor of claim 2, wherein wave functions corresponding to electrons of each of said molecules overlap, resulting in a conjugated intermolecular electron orbital within each of said one-dimensional columns, thereby facilitating migration of electrons in an axial direction along said one-dimensional columns.

5. An organic semiconductor, comprising: an organic semiconductor layer, which layer is formed by epitaxially depositing molecules of a compound selected from a group comprising phthalocyanine, iodinated phthalocyanine, titanyl phthalocyanine, lead phthalocyanine, aluminum phthalocyanine fluoride, aluminum phthalocyanine, pyrazino pyridine, and porphyrins, to form a super-thin film configuration comprising one-dimensional columns of stacked molecules, wherein said one-dimensional columns are separated respectively from each other.

6. The organic semiconductor of claim 5, wherein wave functions corresponding to electrons of each of said molecules overlap, resulting in a conjugated intermolecular electron orbital within each of said one-dimensional columns, thereby facilitating migration of electrons in an axial direction along said one-dimensional columns.

7. The organic semiconductor of claim 5, wherein said one-dimensional columns are in a length range of about 10 angstroms to about 150 angstroms, said one-dimensional columns are separated respectively from each other by a pitch in a pitch range of about 20 angstroms to about 100 angstroms, and mobility of electrons migrating along said one-dimensional columns is in a mobility range of about 1 square-centimeter per Volt per second to about 400 square-centimeters per volt per second.

8. An organic semiconductor, comprising: at least two organic semiconductor layers, each layer being formed by epitaxially depositing molecules of a compound selected from a group comprising phthalocyanine, iodinated phthalocyanine, titanyl phthalocyanine, lead phthalocyanine, aluminum phthalocyanine fluoride, aluminum phthalocyanine, pyrazino pyridine, and porphyrins, to form a super-thin film configuration comprising one-dimensional columns of stacked molecules, wherein said columns are separated respectively from each other; and one conductor layer interposed between each two adjacent layers of the at least two organic semiconductor layers.

9. The organic semiconductor of claim 8, wherein the conductor layer consists of a one-dimensional electric conductor, a two-dimensional electric conductor, a one-dimensional photoconductor or a two-dimensional photoconductor and is aligned in a direction along a gate field within at least one of a source layer, a drain layer and a channel layer of a MOSFET structure.

10. The organic semiconductor of claim 8, wherein the conductor layer consists of a one-dimensional electric conductor, a two-dimensional electric conductor, a one-dimensional photoconductor or a two-dimensional photoconductor and is aligned in a direction perpendicular to a gate field within a gate layer of a MOSFET structure.

11. The organic semiconductor of claim 8, wherein the conductor layer consists of a one-dimensional electric conductor, a two-dimensional electric conductor, a one-dimensional photoconductor or a two-dimensional photoconductor and is aligned in a direction along said one-dimensional columns.

12. The organic semiconductor of claim 8, wherein the conductor layer consists of a one-dimensional electric conductor, a two-dimensional electric conductor, a one-dimensional photoconductor or a two-dimensional photoconductor and is aligned along said one-dimensional columns in at least one of a base layer, emitter layer and collector layer of a transistor.

13. The organic semiconductor of claim 8, wherein the conductor layer consists of a one-dimensional electric conductor, a two-dimensional electric conductor, a one-dimensional photoconductor or a two-dimensional photoconductor and is aligned perpendicular to said one-dimensional columns within a base layer of a transistor.

14. The organic semiconductor of claim 8, wherein wave functions corresponding to electrons of each of said molecules overlap, resulting in a conjugated intermolecular electron orbital within each of said one-dimensional columns, thereby facilitating migration of electrons in an axial direction along said one-dimensional columns.

15. The organic semiconductor of claim 8, wherein said one-dimensional columns in at least one said super-thin film configuration are in a length range of about 10 angstroms to about 150 angstroms, said one-dimensional columns are separated respectively from each other by a pitch in a pitch range of about 20 angstroms to about 100 angstroms, and mobility of electrons migrating along said one-dimensional columns is in a mobility range of about 1 square-centimeter per volt per second to about 400 square-centimeters per volt per second.

16. The organic semiconductor of claim 2, wherein said one-dimensional columns in at least one said super-thin film configuration are in a length range of about 10 angstroms to about 150 angstroms, said one-dimensional columns are separated respectively from each other by a pitch in a pitch range of about 20 angstroms to about 100 angstroms, and mobility of electrons migrating along said one-dimensional columns is in a mobility range of about 1 square-centimeter per volt per second to about 400 square-centimeters per volt per second.

17. The organic semiconductor of claim 7, wherein said one-dimensional columns are about 100 angstroms long.

18. The organic semiconductor of claim 15, wherein said one-dimensional columns in at least one said super-thin film configuration are about 100 angstroms long.

19. The organic semiconductor of claim 16, wherein said one-dimensional columns in at least one said super-thin film configuration are about 100 angstroms long.

20. The organic semiconductor of claim 19, wherein said one-dimensional columns in at least one said super-thin film configuration are about 30 angstroms long.

\* \* \* \* \*